United States Patent
Suda et al.

(10) Patent No.: US 6,842,061 B2
(45) Date of Patent: Jan. 11, 2005

(54) TIMING GENERATING APPARATUS AND TEST APPARATUS

(75) Inventors: Masakatsu Suda, Tokyo (JP); Toshiyuki Okayasu, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 10/844,248

(22) Filed: May 12, 2004

(65) Prior Publication Data

US 2004/0207436 A1 Oct. 21, 2004

Related U.S. Application Data

(63) Continuation of application No. PCT/JP02/11837, filed on Nov. 13, 2002.

(30) Foreign Application Priority Data

Nov. 13, 2001 (JP) ......................................... 2001-348040

(51) Int. Cl.[7] ................................................. H03K 3/00
(52) U.S. Cl. ......................................... 327/291; 327/263
(58) Field of Search ................................. 327/299, 294, 327/291, 264, 263, 156, 147, 94

(56) References Cited

U.S. PATENT DOCUMENTS 5,760,653 A * 6/1998 Soda ........................... 331/1 A
5,905,759 A * 5/1999 Ishida et al. ................. 375/282

FOREIGN PATENT DOCUMENTS

JP 9-5407 1/1997 ....... G01R/31/3183
JP 11-14714 1/1999 ....... G01R/31/3183
JP 11-38100 2/1999 ....... G01R/31/3183

OTHER PUBLICATIONS

Patent Abstracts of Japan, Publication No. 11–038100, Publication Date: Feb. 12, 1999, 1 page.
Patent Abstracts of Japan, Publication No. 11–014714, Publication Date: Jan. 22, 1999, 1 page.
Patent Abstracts of Japan, Publication No. 09–005407, Publication Date: Jan. 10, 1997, 1 page.
International Search Report dated Mar. 4, 2003, 4 pages.

* cited by examiner

*Primary Examiner*—Linh My Nguyen
(74) *Attorney, Agent, or Firm*—Osha & May L.L.P.

(57) ABSTRACT

A timing generating apparatus for generating a timing signal which changes at desired timing includes a first waveform generating unit for generating a first basic waveform whose value changes only at desired change timing of a basic frequency, a PLL for generating a sampling clock whose frequency is an integer multiple of the basic frequency and whose phase is more stable than the basic waveform based on a PLL input signal whose frequency is an integer multiple of the basic frequency or a reciprocal of an integer multiple thereof, a first sampling unit for outputting a first sampling signal which results from sampling the first basic waveform with the sampling clock, and an output unit for outputting the timing signal based on the first sampling signal.

14 Claims, 8 Drawing Sheets

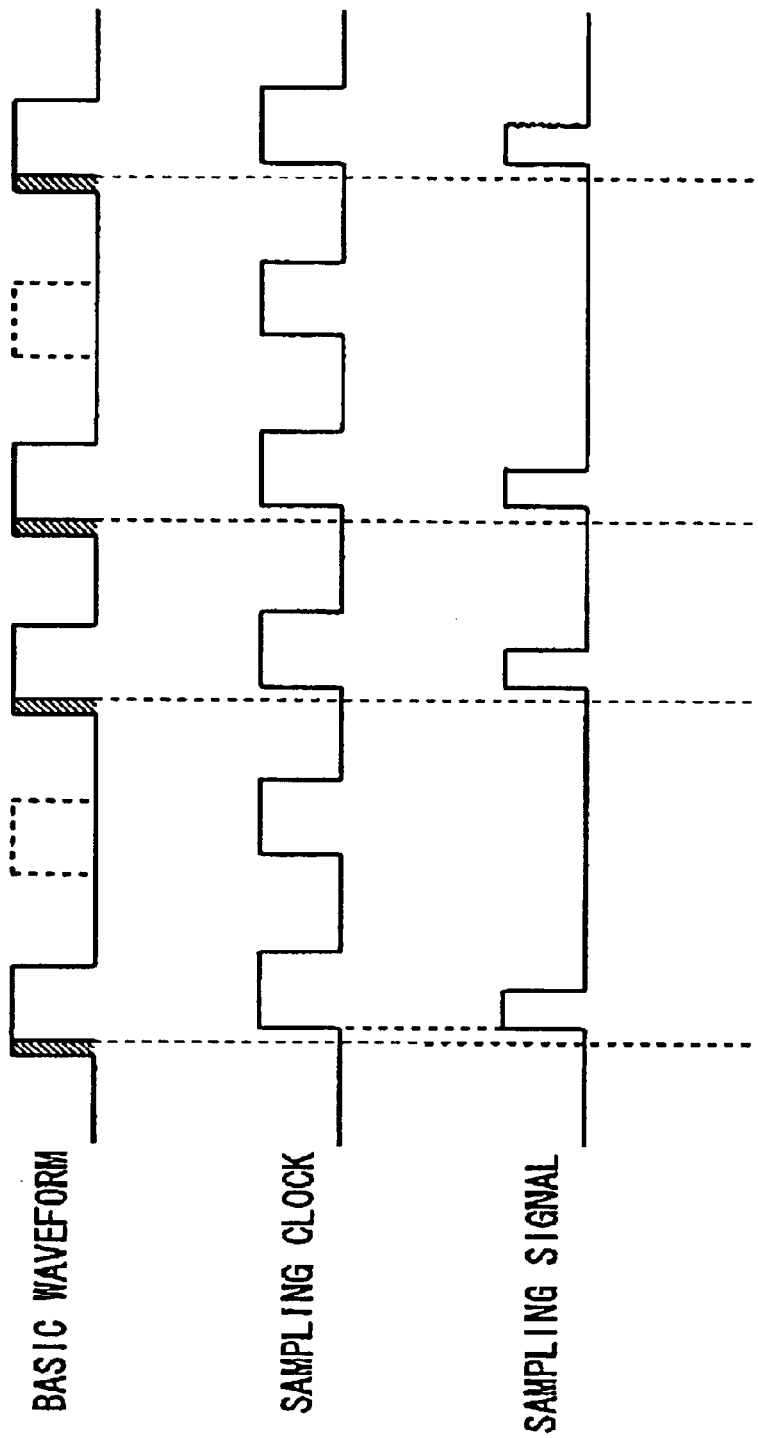

TIMING GENERATING APPARATUS AND TEST APPARATUS

The present application is a continuation application of PCT/JP02/11837 filed on Nov. 13, 2002 which claims the benefit of, and priority from, a Japanese patent application No. 2001-348040 filed on Nov. 13, 2001, the entire contents of which are incorporated herein by reference for all purposes.

BACKGROUND OF THE INVENTION

1. Field of the Invention

The present invention relates to a timing generating apparatus for generating a timing signal whose value changes at desired timing and a test apparatus for testing an electronic device. More particularly, the present invention relates to a timing generating apparatus for generating a timing signal whose jitter is small.

2. Related Art

Recently, a test apparatus for testing an electronic device such as a semiconductor device includes a timing generating apparatus for generating a desired timing signal. For example, it supplies a test signal to the electronic device at the timing based on the timing signal generated by the timing generator. The timing generating apparatus receives a reference clock and delays the reference clock by a desired time interval so as to generate a desired timing signal.

For example, the timing generating apparatus includes a variable delay circuit unit for receiving the reference clock and delaying the reference clock by a desired time interval and a linearization memory for controlling the delay amount of the variable delay circuit unit. Generally, the variable delay circuit unit includes a plurality of delay elements. The linearization memory stores a delay setting value in response to linearization of a desired delay amount of the variable delay circuit unit. The variable delay circuit delays the reference clock by passing the reference clock through a route of a predetermined delay element based on the data stored in the linearization memory. The data stored in the linearization memory is predetermined by design information of the delay elements, where an error occurs between the delay amount of the variable delay circuit unit and the delay setting value which is a desired delay amount due to the variation in manufacture of the delay elements or the surrounding temperature in use.

Since the error is not necessarily constant to each of the delay setting values, jitter occurs in the timing signal generated by the timing generating apparatus. Accordingly, the timing generating apparatus is desirable to be capable of generating a timing signal from which the jitter is eliminated.

And in order to reduce the jitter, the timing generator may be provided with a frequency synthesizer. In this case, although the frequency synthesizer can generate a timing signal whose jitter is small for a certain period, there is a problem that it is difficult to change the period in real time. Due to these problems, it is difficult to test the electronic device with high precision in the test apparatus.

SUMMARY OF THE INVENTION

Accordingly, it is an object of the present invention to provide a timing generating apparatus and a test apparatus, which is capable of overcoming the above drawbacks accompanying the conventional art. The above and other objects can be achieved by combinations described in the independent claims. The dependent claims define further advantageous and exemplary combinations of the present invention.

In order to solve the problems above, according to the first aspect of the present invention, a timing generating apparatus for generating a timing signal which changes at desired timing includes a first waveform generating unit for generating a first basic waveform whose value changes only at desired change timing of a basic frequency, a PLL for generating a sampling clock whose frequency is an integer multiple of the basic frequency and whose phase is more stable than the basic waveform based on a PLL input signal whose frequency is an integer multiple of the basic frequency or a reciprocal of an integer multiple thereof, a first sampling unit for outputting a first sampling signal which results from sampling the first basic waveform with the sampling clock, and an output unit for outputting the timing signal based on the first sampling signal.

The timing generating apparatus may further include a first selecting unit for selecting either the first basic waveform or the first sampling signal and supplying the first basic waveform or the first sampling signal selected to the output unit as the first sampling signal.

The timing generating apparatus may further include a first variable delay circuit for delaying the sampling clock by a desired time interval, wherein the first sampling unit samples the first basic waveform based on the sampling clock delayed by the first variable delay circuit.

The timing generating apparatus may further include a first variable delay circuit for delaying the first sampling signal outputted by the first sampling unit by a desired time interval, wherein the first selecting unit selects the first sampling signal outputted by either the first basic waveform or the first variable delay circuit.

The first sampling unit may hold a value of the first basic waveform at a leading edge of the sampling clock for a predetermined time interval, and output the value of the first basic waveform held as a value of the first sampling signal.

The first sampling unit may be a D flip-flop whose input terminal receives the first basic waveform, whose clock terminal receives the sampling clock, and whose output terminal supplies an output thereof to a reset terminal of the D flip-flop.

The first variable delay circuit may delay the sampling clock by a time interval which is larger than jitter of the first basic waveform.

The timing generating apparatus may further include a period generating unit for generating a PLL input signal whose frequency is an integer multiple of the basic frequency or a reciprocal of an integer multiple thereof, wherein the PLL may include a frequency synthesizer for generating the sampling clock whose jitter is smaller than that of the PLL input signal and whose period is substantially the same as the PLL input signal based on the PLL input signal.

The period generating unit may generate the PLL input signal by receiving a reference clock, modulating a phase of the reference clock with a predetermined gradation number and taking a desired pulse of the reference clock modulated, and the frequency synthesizer may include an oscillator for generating an oscillating signal of a desired frequency, a first frequency divider for dividing a frequency of the PLL input signal into a same frequency division number as the gradation number, a second frequency divider for dividing a frequency of the oscillating signal into a frequency division number which is an integer multiple of the gradation number, and a phase comparator for controlling a period of the oscillating signal generated by the oscillator based on a phase difference between the PLL input signal whose frequency is divided by the first frequency divider and the oscillating signal whose frequency is divided by the second frequency divider.

The first waveform generating unit may receive the reference clock and generate the first basic waveform based on the reference clock.

The timing generating apparatus may further include a second waveform generating unit for generating a second basic waveform whose value changes only at change timing of the basic frequency and which has a predetermined phase difference from the first basic waveform, and a second sampling unit for outputting a second sampling signal which results from sampling the second basic waveform with the sampling clock delayed by the predetermined phase difference, wherein the output unit may output the timing signal based on the first and second sampling signals.

The output unit may include a latch unit for generating the timing signal by holding H logic in response to an edge of the first sampling signal, whereas holding L logic in response to an edge of the second sampling signal.

The timing generating apparatus may further include a third waveform generating unit for generating a third basic waveform whose value changes only at change timing of the basic frequency and whose phase is later than the first basic waveform, and a fourth waveform generating unit for generating a fourth basic waveform whose value changes only at change timing of the basic frequency and whose phase is later than the second basic waveform, wherein the first sampling unit may generate the first sampling signal by sampling a signal interleaved with the first and third basic waveforms based on the sampling clock, and the second sampling unit may generate the second sampling signal by sampling a signal interleaved with the second and fourth basic waveforms based on the sampling clock.

According to the second aspect of the present invention, a test apparatus for testing an electronic device includes a pattern generating unit for generating a test signal to test the electronic device, a timing generating apparatus for generating a timing signal which changes at desired timing, a waveform adjusting unit for adjusting the test signal and supplying the test signal adjusted to the electronic device based on the timing signal, and a judging unit for judging quality of the electronic device based on an output signal outputted by the electronic device based on the test signal, wherein the timing generating apparatus includes a first waveform generating unit for generating a first basic waveform whose value changes only at change timing of a basic frequency, a PLL for generating a sampling clock whose frequency is an integer multiple of the basic frequency and whose phase is more stable than the basic waveform based on a PLL input signal whose frequency is an integer multiple of the basic frequency or a reciprocal of an integer multiple thereof, a first sampling unit for outputting a first sampling signal which results from sampling the first basic waveform with the sampling clock, and an output unit outputs the timing signal based on the sampling signal.

The summary of the invention does not necessarily describe all necessary features of the present invention. The present invention may also be a sub-combination of the features described above.

BRIEF DESCRIPTION OF DRAWINGS

FIG. 5A shows an example of the configuration of the sampling unit and a variable delay circuit, and FIG. 5B shows another example of the configuration of the sampling unit and a variable delay circuit.

FIG. 6 shows input-output signals of the sampling unit.

DETAILED DESCRIPTION OF THE INVENTION

The invention will now be described based on the preferred embodiments, which do not intend to limit the scope of the present invention, but exemplify the invention. All of the features and the combinations thereof described in the embodiment are not necessarily essential to the invention.

Figure 1:
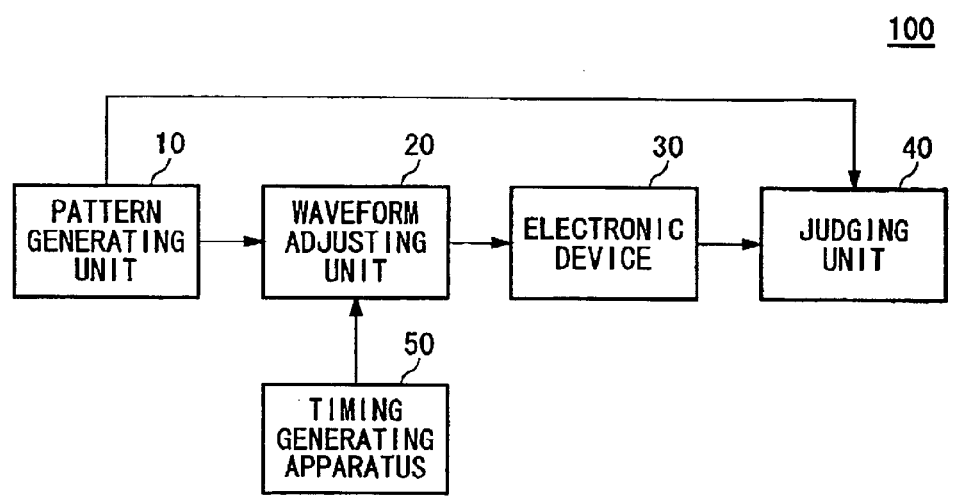
FIG. 1 shows an example of the configuration of a test apparatus of this invention.

FIG. 1 shows an example of the configuration of a test apparatus 100 of the present invention. The test apparatus 100 tests an electronic device 30. The test apparatus 100 includes a pattern generating unit 10, a waveform adjusting unit 20, a timing generating apparatus 50, and a judging unit 40. The pattern generating unit 10 generates a test signal to test the electronic device 30, and supplies it to the waveform adjusting unit 20.

The timing generating apparatus 50 generates the timing signal whose value changes at desired timing. The timing generating apparatus 50 receives a reference clock, and generates the timing signal based on the reference clock received.

The waveform adjusting unit 20 adjusts the test signal received, and supplies the test signal adjusted to the electronic device 30. The waveform adjusting unit 20 may supply the test signal to the electronic device 30 at the desired timing. In this embodiment, the waveform adjusting unit 20 supplies the test signal to the electronic device 30 in response to the change of the value of the timing signal received from the timing generating apparatus 50.

The judging unit 40 judges the quality of the electronic device 30 based on an output signal outputted by the electronic device 30 in response to the test signal. The judging unit 40 may compare an expected signal which is to be outputted by the electronic device 30 in response to the test signal, while the output signal is outputted by the electronic device 30, so as to judge the quality of the electronic device 30. In this case, the pattern generating unit 10 may generate the expected signal based on the test signal generated and supply it to the judging unit 40.

Figure 2:
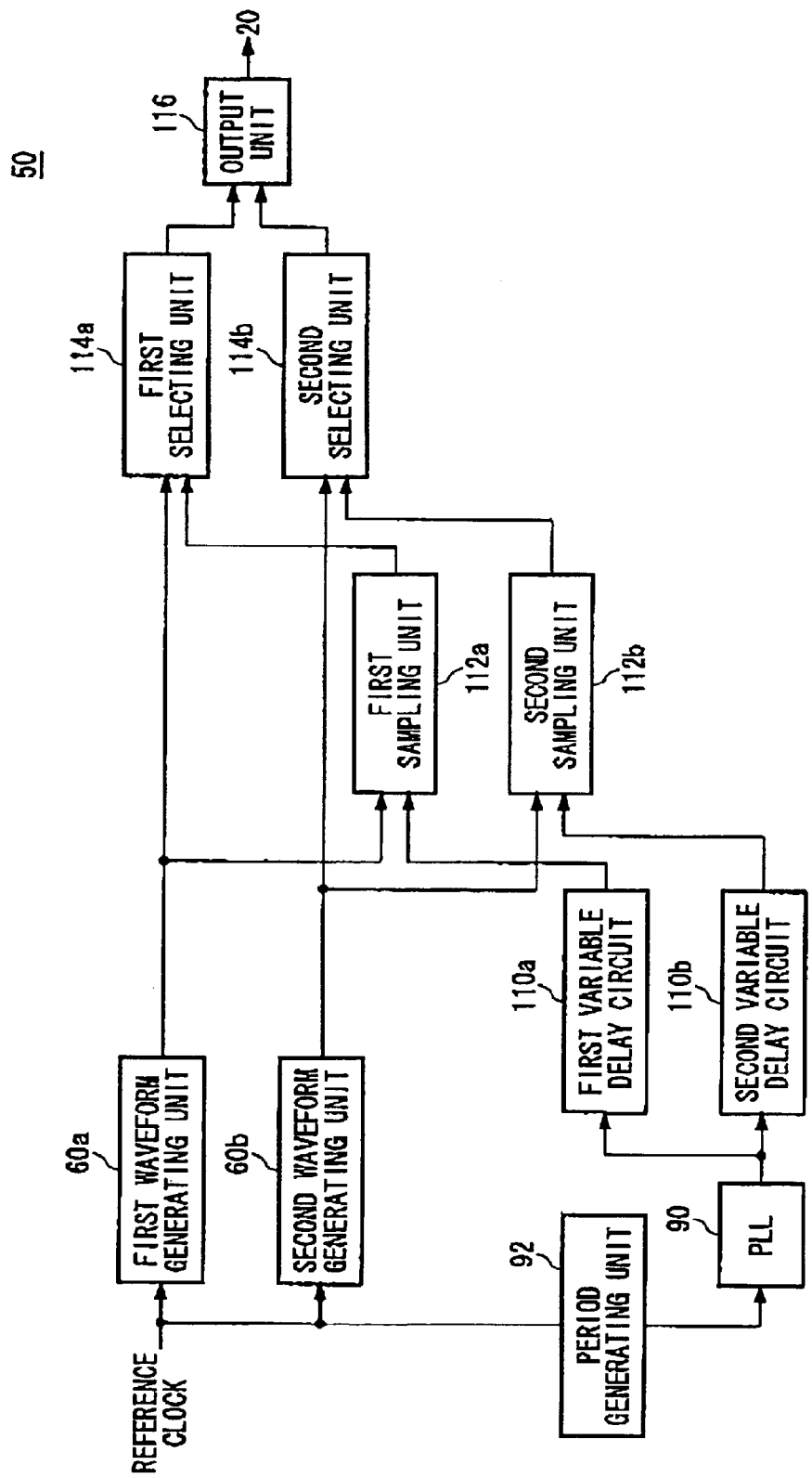
FIG. 2 shows an example of the configuration of a timing generating apparatus.

FIG. 2 shows an example of the configuration of a timing generating apparatus 50. The timing generating apparatus 50 includes a first waveform generating unit 60a, a second waveform generating unit 60b, a PLL 90, a period generating unit 92, a first variable delay circuit 110a, a second variable delay circuit 110b, a first sampling unit 112a, a second sampling unit 112b, a first selecting unit 114a, a second selecting unit 114b, and an output unit 116. The timing generating apparatus 50, with regard to the test cycle of the electronic device, has both an RTTC (Real Time Timing Control) mode in which the phase of a pulse of the timing signal changes in real time and a non-RTTC mode in which the phase of a pulse of the timing signal does not change in real time. Hereafter, the operation of each of the elements in the non-RTTC mode will be described.

The first waveform generating unit 60*a* generates a first basic waveform whose value changes only at the change timing of a desired basic frequency. In this embodiment, the first waveform generating unit 60*a* generates the first basic waveform based on the reference clock. For example, the first waveform generating unit 60*a* delays the reference clock, takes desired one of the pulses of the reference clock, and outputs a desired pattern of the basic frequency as the first basic waveform.

The period generating unit 92 generates a PLL input signal of an integer multiple of the basic frequency or the reciprocal of an integer multiple thereof. The period generating unit 92 supplies the PLL input signal generated to the PLL 90.

The PLL 90 generates a sampling clock which has an integer multiple of the basic frequency and whose phase is more stable than the first basic waveform based on the PLL input signal whose frequency is an integer multiple of the basic frequency or the reciprocal of an integer multiple thereof. In other words, the PLL 90 receives the PLL input signal whose frequency is an integer multiple of the basic frequency of the first basic waveform or the reciprocal of an integer multiple thereof, and generates the sampling clock whose jitter is smaller than that of the first basic waveform. The PLL 90 includes an oscillator 94 voltage-controlled as described below in FIG. 4, so that it can generate the a sampling clock whose jitter is small.

The first variable delay circuit 110*a* delays the sampling clock by a desired time interval. The first variable delay circuit 110*a* delays the sampling clock by a time interval which is larger than the jitter of the first basic waveform. The jitter of the first basic waveform may be measured in advance or calculated from the design information of the first waveform generating unit 60*a*. The first variable delay circuit 110*a* preferably delays the sampling clock by a time interval which is larger than the maximum jitter of the first basic waveform.

The first sampling unit 112*a* outputs a first sampling signal which results from sampling the first basic waveform with the sampling clock. For example, the first sampling unit 112*a* outputs a waveform which results from sampling the first basic waveform with the sampling clock as the first sampling signal. For example, the first sampling unit 112*a* holds a value of the first basic waveform at the leading edge of the sampling clock for a predetermined time interval, and outputs the value of the first basic waveform held as the value of the first sampling signal. Since the first basic waveform of a desired pattern is sampled with the sampling clock whose jitter is small, a first sampling signal whose jitter is small and which has a desired pattern can be generated.

The first selecting unit 114*a* selects either the first basic waveform or the first sampling signal, and supplies the first basic waveform or the first sampling signal selected to the output unit 116 as the first sampling signal. If the timing generating apparatus 50 is the non-RTTC mode, the first selecting unit 114*a* selects the first sampling signal.

Next, the timing generating apparatus 50 in the RTTC mode will be described. The first waveform generating unit 60*a* outputs a first basic waveform of a desired pattern. In this case, the first waveform generating unit 60*a* changes the phase of the reference clock in real time so as to generate the desired pattern. In other words, the first basic waveform does not have any basic frequency. The first selecting unit 114*a* selects a first basic waveform and supplies the first basic waveform selected.

According to the timing generating apparatus 50 of this embodiment, it is possible to easily generate the sampling signal and the timing signal with high precision. In addition, it is possible to reduce the amount of the hardware of the timing generating apparatus 50 having both the RTTC and non-RTTC modes. And the output unit 116 may include a set-reset latch. In this case, the set-reset latch generates the timing signal based on the signals selected by both the first and second selecting units 114*a* and 114*b*.

The second waveform generating unit 60*b* has the same function as the first waveform generating unit 60*a*. The second waveform generating unit 60*b* generates a second basic waveform whose value changes only at the change timing of the same basic frequency as the basic frequency of the first waveform generating unit 60*a* and which has a predetermined phase difference from the first basic waveform.

The second variable delay circuit 110*b* has the same function as the first variable delay circuit 110*a*. The second variable delay circuit 110*b* delays the sampling clock by a desired time interval. The second variable delay circuit 110*b* delays the sampling clock by a time interval which is larger than the jitter of the second basic waveform. For example, the second variable delay circuit 110*b* delays the second sampling clock by a time interval which results from adding the maximum jitter of the second basic waveform and the phase difference between the first and second basic waveforms, and supplies it to the second sampling unit 112*b*.

The second sampling unit 112*b* has the same function as the first sampling unit 112*a*. The second sampling unit 112*b* outputs a second sampling signal which results from sampling the second basic waveform with the sampling clock outputted by the second variable delay circuit 110*b*.

The second selecting unit 114*b* has the same function as the first selecting unit 114*a*. The second selecting unit 114*b* selects either the second basic waveform or the second sampling signal, and supplies the second basic waveform or the second sampling signal selected to the output unit 116 as the second sampling signal.

The output unit 116 generates the timing signal based on the first and second sampling signals and outputs the timing signal generated. The output unit 116 may include a set-reset latch as described above. The output unit 116 may generate the leading edge of the timing signal in response to the edge of the first sampling signal and the rear edge of the timing signal in response to the edge of the second sampling signal. For example, the output unit 116 may include a latch unit for generating the timing signal by holding H logic in response to the edge of the first sampling signal whereas holding L logic in response to the edge of the second sampling signal.

According to the timing generating apparatus 50, it is possible to easily generate a pulse having leading and rear edges whose phase precision is high.

Figure 3:
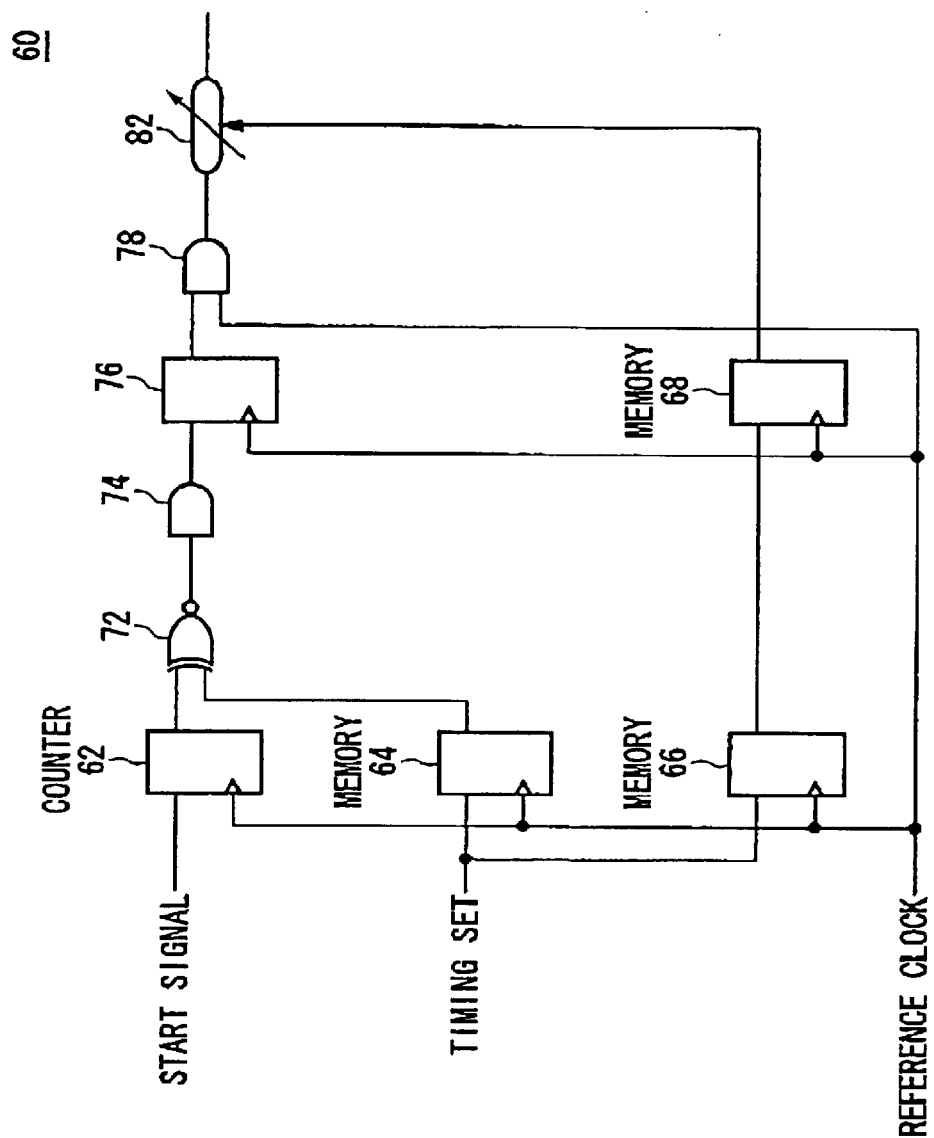
FIG. 3 shows an example of the configuration of a waveform generating unit.

FIG. 3 shows an example of the configuration of the waveform generating unit 60. The first and second waveform generating units 60*a* and 60*b* described in connection with FIG. 2 may have the same configuration as the waveform generating unit 60. The waveform generating unit 60 receives a reference clock and generates a pattern which results from delaying a desired pulse of the reference clock by a desired time interval. The waveform generating unit 60 includes a counter 62, memories 64 to 68, and a variable delay circuit unit 82.

The memory 64 stores one of the pulses of the reference clock which is to be delayed and outputted by the variable delay circuit unit 82. For example, the memory 64 stores an integer in the form of a binary system which indicates the ordinal position of the pulse of the reference clock to be supplied by the variable delay circuit unit 82. The memory 66 stores a delay amount of the variable delay circuit unit 82. The memories 64 and 66 receive a timing set, signal which indicates the delay amount of the pulse to be outputted by the variable delay circuit unit 82 with regard to the start signal. The memory 64 stores a value which results from dividing the delay amount indicating the timing set signal by the period of the reference clock. The memory 66 stores a value which is the remainder after dividing the delay amount indicating the timing set signal by the period of the reference clock.

The counter 62 counts the number of pulses of the reference clock until the start signal is inputted. If the value of the counter 62 is the same as the value stored in the memory 64, an XOR circuits 72 and an AND circuit 74 supply the pulse to the variable delay circuit unit 82 via a flip-flop 76 and an AND circuit 78. As above, the delay of an integer multiple of the period of the reference clock can be generated.

The memory 68 stores a delay control signal of the variable delay circuit unit 82. The memory 68 supplies the delay control signal based on the value stored in the memory 66 to the variable delay circuit unit 82. The variable delay circuit unit 82 delays and outputs the pulse received from XOR circuits 72 and an AND circuit 74 by the delay amount based on the delay control signal received. In other words, the variable delay circuit unit 82 generates the delay amount less than or equal to the period of the reference clock. As above, the waveform generating unit 60 can output a basic waveform pulse of desired timing. And if the timing generating apparatus 50 is in the RTTC mode, the waveform generating unit 60 generates the basic waveform of a desired pattern, and if the timing generating apparatus 50 is in the non-RTTC mode, the waveform generating unit 60 generates the basic waveform of the basic frequency.

Figure 4:
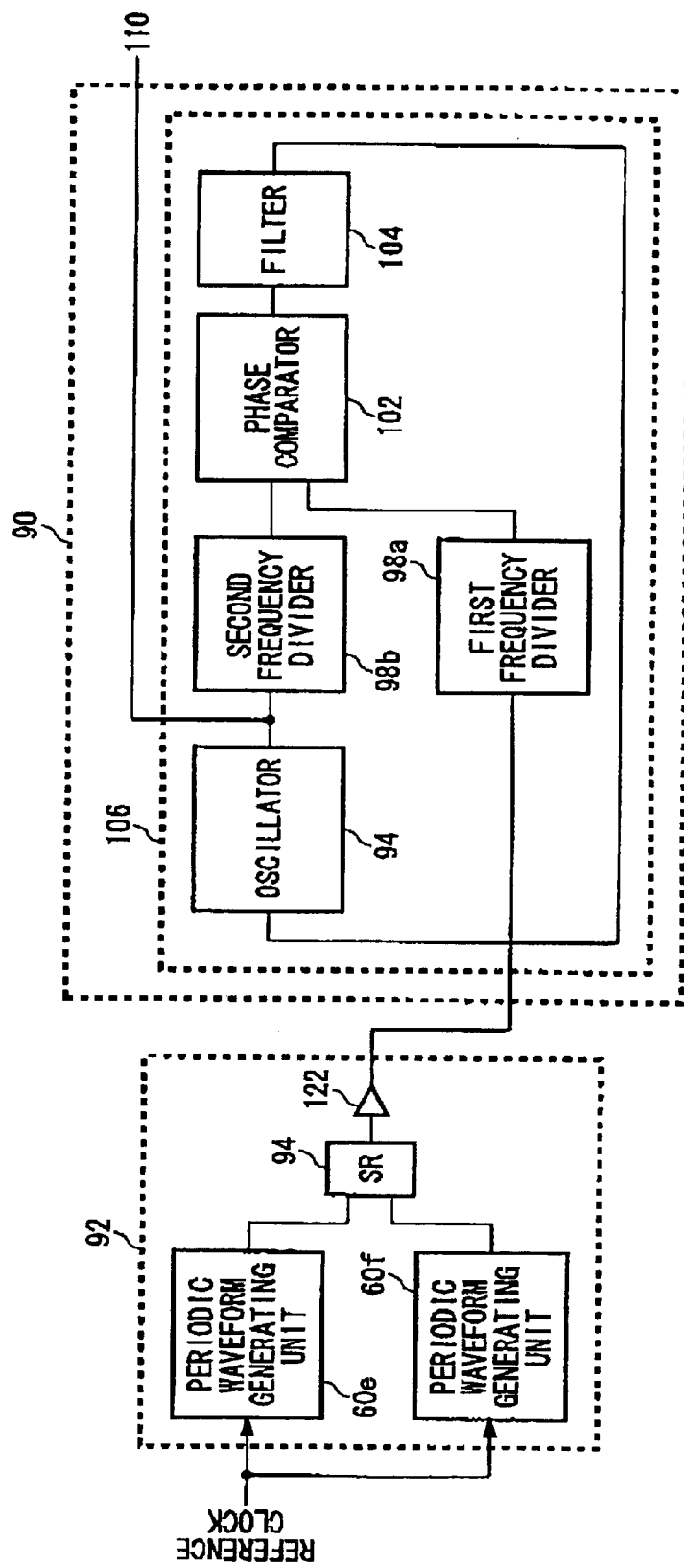
FIG. 4 shows an example of the configuration of a period generating unit and a PLL.

FIG. 4 shows example of the configuration of the period generating unit 92 and the PLL 90. In this embodiment, the timing generating apparatus 50 further includes a period generating unit 92 for generating a PLL input signal whose frequency is an integer multiple of the basic frequency of the basic waveform generated by the waveform generating unit 60 in the non-RTTC mode or the reciprocal of an integer multiple thereof.

The period generating unit 92 modulates the reference clock with a predetermined gradation number and takes a desired pulse of the reference clock modulated so as to generate the PLL input signal described above. The period generating unit 92 includes fifth and sixth waveform generating units 60e and 60f, a set-reset latch 120, and a buffer 122. The fifth and sixth waveform generating units 60e and 60f have the same function and configuration as those of the waveform generating unit 60 described in connection with FIG. 3.

The fifth waveform generating unit 60e receives the reference clock and generates a signal of a desired period based on the reference clock, whereas the sixth waveform generating unit 60f receives the reference clock and generates a signal whose phase is later than the signal generated by the fifth waveform generating unit 60e based on the reference clock. The set-reset latch 120 generates the PLL input signal described above based on the signals generated by the fifth and sixth waveform generating units 60e and 60f. And the set-reset latch 120 supplies the PLL input signal generated to the PLL 90 via the buffer 122.

The PLL 90 includes a frequency synthesizer 106. The frequency synthesizer 106 generates a sampling clock whose jitter is smaller than the PLL input signal and whose period is approximately the same as the PLL input signal based on the PLL input signal. The frequency synthesizer 106 includes an oscillator 94, a first frequency divider 98a, a second frequency divider 98b, a phase comparator 102, and a filter 104.

The oscillator 94 generates an oscillating signal of a desired period. And the first frequency divider 98a divides the frequency of the PLL input signal into the same frequency division number as the gradation number of the period generating unit 92. And the second frequency divider 98b divides the frequency of the PLL input signal into a frequency division number which is an integer multiple of the gradation number. Hereafter, it will be described that the period generating unit 92 generates the PLL input signal whose frequency is approximately the same as the basic frequency, and the first and second frequency dividers 98a and 98b have the same frequency division number as the gradation number.

The phase comparator 102 controls the period of the oscillating signal generated by the oscillator 94 based on the phase difference between the PLL input signal whose frequency has been divided by the first frequency divider 98a and the oscillating signal whose frequency has been divided by the second frequency divider 98b. In other words, the phase comparator 102 controls the period of the oscillating signal generated by the oscillator 94 in order that the phase difference is small. The phase comparator 102 supplies a phase difference signal which indicates the phase difference to the oscillator 94 via the filter 104. The oscillator 94 may be a ring oscillator capable of changing the oscillation period by a control voltage. In this case, the phase comparator 102 may control the oscillation period by controlling the control voltage. The filter 104 receives the phase difference signal and supplies a desired frequency component of the phase difference signal to the oscillator 94.

In this embodiment, since the first and second frequency dividers 98a and 98b have the same frequency division number, the oscillator 94 generates a signal of the same frequency as the PLL input signal. The PLL 90 outputs the signal generated by the oscillator 94 as the sampling signal described above. The ring oscillator which is the oscillator 94 can generate a signal whose jitter is small.

And if the period generating unit 92 generates a PLL input signal of a period T+r in response to the period T of the reference clock, the period generating unit 92 performs the operation of sequentially delaying desired pulses of the reference clock by r, 2r, 3r, . . . in the variable delay circuit unit 82 (cf. FIG. 3) and eliminating the pulses for each of a predetermined number of pulses in the counter 62, the memory 64, XOR circuits 72, and an AND circuit (cf. FIG. 3). The delay amounts of the variable delay circuit unit 82 have errors in response to the corresponding delay setting values. If the error of each of the delay amounts of the variable delay circuit unit 82 is not constant, jitter might occur in the PLL input signal. However, in this embodiment, since the first frequency divider 98a has the same frequency division number as the gradation number of the period generating unit 92, the phase comparator 102 can compare the edge of the pulse of the PLL input signal whose error is approximately constant with the edge of the oscillating signal. Accordingly, the oscillator 94 can generate the sampling clock whose jitter caused by the error is small.

And although the frequency synthesizer 106 of this embodiment generates the sampling clock whose period is approximately the same as the PLL input signal, alternatively it may generate the sampling clock whose period is an integer multiple of the PLL input signal. And by controlling the ratio of the frequency division number of the first frequency divider 98a to the frequency division number of the second frequency divider 98b, it is possible to easily generate the sampling clock whose period is an integer multiple of the PLL input signal and whose jitter is small. In addition, although the first frequency divider 98a of this embodiment has the same frequency division number as the gradation number, alternatively it may have the frequency division number which is smaller than the gradation number and take a frequency based on the gradation number and the frequency division number as the cut-off frequency of the filter 104.

Figure 5A:
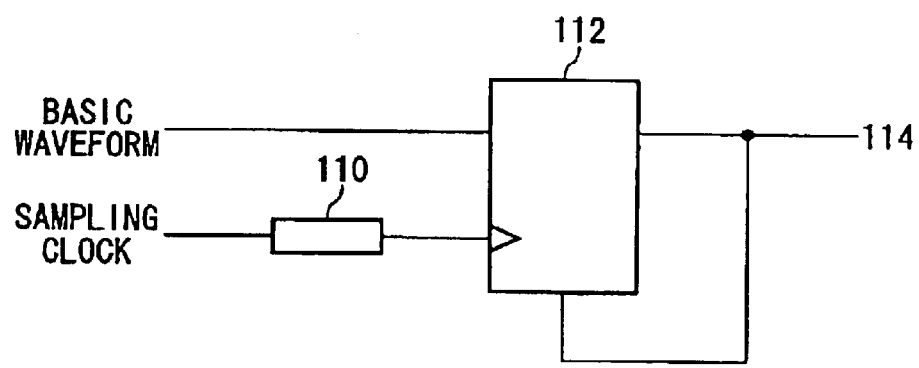
FIGS. 5A and 5B show an example of the configuration of a sampling unit.
Figure 5B:
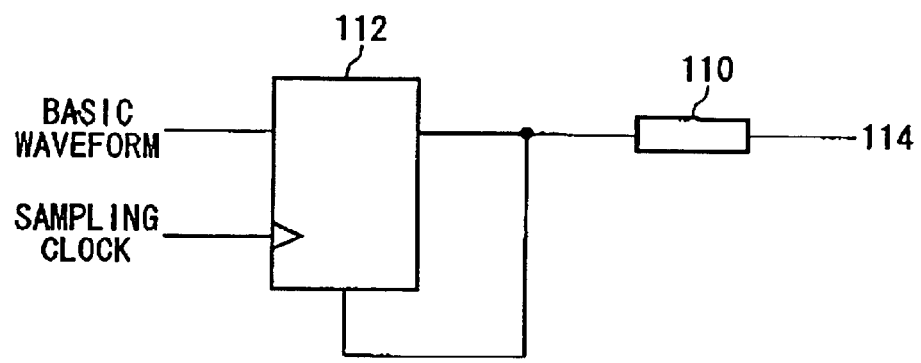

FIGS. 5A and 5B show an example of the configuration of a sampling unit 112. The first and second sampling units 112a and 112b described in connection with FIG. 2 may have the same function and configuration as those of the sampling unit 112.

FIG. 5A shows an example of the configuration of the sampling unit 112 and the variable delay circuit 110. The sampling unit 112 is a D flip-flop which receives the basic waveform through its input terminal and the sampling clock through its clock terminal and supplies its output from its output terminal to its reset terminal.

The variable delay circuit 110 receives the sampling clock and supplies the sampling clock delayed by a desired time interval to the sampling unit 112. And the variable delay circuit 110 delays the sampling clock by a time interval which is larger than the maximum jitter of the basic waveform to supply it to the sampling unit 112.

The sampling unit 112 holds and outputs the value of the basic waveform at the edge of the sampling clock. And the sampling unit 112 resets the value held by feeding its output back to its reset terminal. In other words, the sampling unit 112 holds the value of the basic waveform at the edge of the sampling clock for the delay time interval of the feedback route, and outputs it as the sampling signal described above.

The sampling clock is a clock which is smaller than the jitter as described above, so the sampling unit 112 outputs the value of the basic waveform based on the edge of the sampling clock, whereby it is possible to generate the sampling signal whose jitter is small.

FIG. 5B shows another example of the configuration of the sampling unit 112 and the variable delay circuit 110. In this embodiment, the variable delay circuit 110 delays the sampling signal outputted by the sampling unit 112 as much as a desired time interval. In this case, the selecting unit 114 described in connection with FIG. 2 selects either the basic waveform or the sampling signal outputted by the variable delay circuit 110. And in this embodiment, a route delay amount of the PLL 90 (cf. FIG. 2) is preferably larger than the jitter of the basic waveform.

FIG. 6 shows the input-output signals of the sampling unit 112. The sampling unit 112 receives the basic waveform and the sampling clock shown in FIG. 6. The basic waveform has the jitter shown by hatching sections in FIG. 6. And the basic waveform has the basic frequency shown by continuous and dashed lines in FIG. 6. The pulses shown by the dashed lines in FIG. 6 are those eliminated by the first or second waveform generating unit 60a or 60b.

The sampling clock is delayed in comparison with the basic waveform as much as the delay amount of the variable delay circuit 110 and/or the route delay amount of the PLL 90 and then inputted to the sampling unit 112. As described above, since the sampling clock is delayed and inputted as much as a time interval which is larger than the maximum jitter of the basic waveform, the leading edge of the sampling clock is delayed as much as the jitter component of the basic waveform.

The sampling unit 112 in this embodiment outputs the value of the basic waveform at the leading edge of the sampling clock as the value of the sampling signal, and holds the value of the basic waveform for a desired time interval through the feedback described above. Since the basic waveform has almost no jitter component at the timing of the leading edge of the sampling clock, the sampling unit 112 can generate the sampling signal which has a desired pattern and whose jitter is small.

Figure 7:
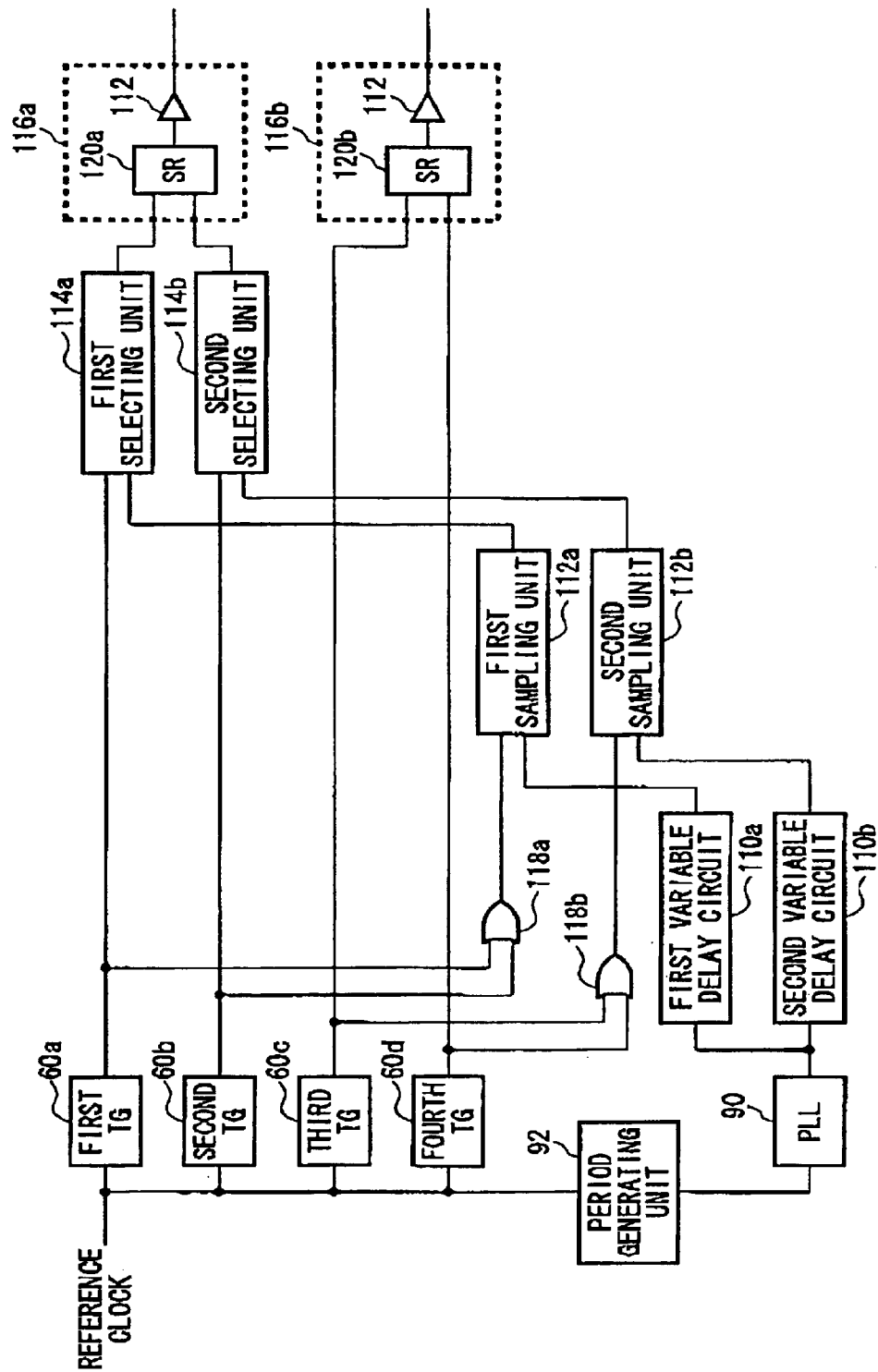
FIG. 7 shows another example of the configuration of the timing generating apparatus.

FIG. 7 shows another example of the configuration of the timing generating apparatus 50. The timing generating apparatus 50 includes, in addition to the configuration of the timing generating apparatus 50 described in connection with FIG. 2, third and fourth waveform generating units 60c and 60d, and OR circuits 118a and 118b. Matters in FIG. 7 given the same symbols as those in FIG. 2 have the same function and configuration as those described in connection with FIG. 2.

The third waveform generating unit 60c has the same function and configuration as those of the first waveform generating unit 60a described in connection with FIG. 2. The third waveform generating unit 60c generates the third basic waveform whose value changes only at the change timing of the basic frequency and whose phase is later than the first basic waveform. In this embodiment, the third waveform generating unit 60c generates the third basic waveform whose phase is later than the first basic waveform by half of the period.

The OR circuit 118a generates a signal interleaved with the first and third basic waveforms. In this embodiment, the OR circuit 118a generates the logical sum of the first and third basic waveforms.

The fourth waveform generating unit 60d has the same function and configuration as those of the second waveform generating unit 60b described in connection with FIG. 2. The fourth waveform generating unit 60d generates the fourth basic waveform whose value changes only at the change timing of the basic frequency and whose phase is later than the second basic waveform. In this embodiment, the fourth waveform generating unit 60d generates the fourth basic waveform whose phase is later than the second basic waveform by half of the period.

The OR circuit 118b generates a signal interleaved with the second and fourth basic waveforms. In this embodiment, the OR circuit 118b generates the logical sum of the third and fourth basic waveforms.

The first sampling unit 112a samples the signal interleaved with the first and third basic waveforms based on the sampling clock described above to generate the first sampling signal. Meanwhile, the second sampling unit 112b samples the signal interleaved with the second and fourth basic waveforms based on the sampling clock described above to generate the third sampling signal.

And the PLL 90 generates the sampling clock of a frequency twice the basic frequency. As described above, the PLL 90 has a frequency which is an integer multiple of the basic frequency, so that it can easily generate the sampling clock whose jitter is small. The output units 116a and 116b have the same function as the output unit 116 described in connection with FIG. 2. As described above, each of the output units 116a and 116b includes a set-reset latch 120. The set-reset latch 120 outputs the timing signal via the buffer 112.

According to the timing generating apparatus 50 of this embodiment, it is possible to easily generate the high frequency timing signal whose jitter is small in the non-RTTC mode. And according to the timing generating apparatus 50 of this embodiment, since the basic waveform is sampled with the same route by sampling the basic waveform interleaved, it is possible to generate the timing signal with high precision by eliminating the skew between routes in comparison with interleaving the signal which results from sampling the basic waveform with a plurality of routes.

Figure 8:
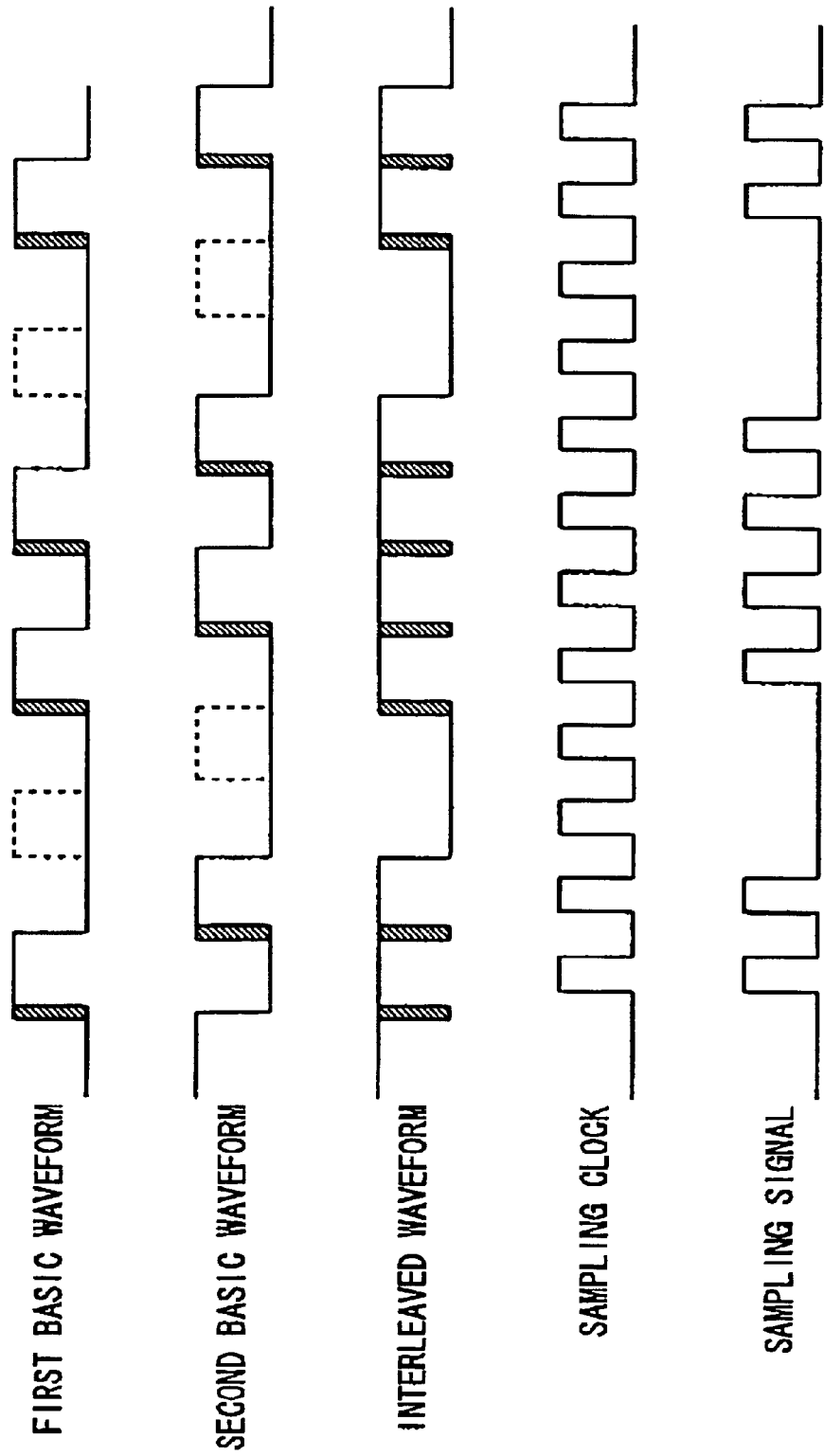
FIG. 8 shows an operation of a first sampling unit of the timing generating apparatus described in connection with FIG. 7.

FIG. 8 shows the operation of the first sampling unit 112a of the timing generating apparatus 50 described in connection with FIG. 7. The first waveform generating unit 60a generates the first basic waveform as shown in FIG. 8. The third waveform generating unit 60c generates the third basic waveform whose phase is later than the first basic waveform by half of the period as shown in FIG. 8. In FIG. 8, the jitter component of each of the basic waveforms is shown by the hatching sections.

The OR circuit 118a generates an interleaved waveform which is interleaved with the first and third basic waveforms. The first sampling unit 112a receives the sampling clock whose frequency is twice the basic frequency as shown in FIG. 8, and samples the interleaved waveform based on the sampling clock received. In the same way as the first sampling unit 112a described in connection with FIG. 2, even in the first sampling unit 112a of this embodiment, the sampling signal from which the jitter component of the interleaved waveform has been eliminated can be generated. The second sampling unit 112b described in connection with FIG. 7 performs the same operation as the first sampling unit 112a described in connection with FIG. 8.

Although the present invention has been described by way of exemplary embodiments, it should be understood that those skilled in the art might make many changes and substitutions without departing from the spirit and the scope of the present invention, which is defined only by the appended claims.

As obvious from the description above, according to a data transmission apparatus of the present invention, it is possible to reduce the amount of the hardware of the timing generating apparatus having both the RTTC and non-RTTC modes. In addition, it is possible to generate the timing signal whose jitter is small.

What is claimed is:

1. A timing generating apparatus for generating a timing signal which changes at desired timing, comprising:
   a first waveform generating unit for generating a first basic waveform whose value changes only at desired change timing of a basic frequency;
   a PLL for generating a sampling clock whose frequency is an integer multiple of said basic frequency and whose phase is more stable than said first basic waveform based on a PLL input signal whose frequency is an integer multiple of said basic frequency or a reciprocal of an integer multiple thereof;
   a first sampling unit for outputting a first sampling signal which results from sampling said first basic waveform with said sampling clock; and
   an output unit for outputting said timing signal based on said first sampling signal.

2. A timing generating apparatus as claimed in claim 1, further comprising a first selecting unit for selecting either said first basic waveform or said first sampling signal and supplying said first basic waveform or said first sampling signal selected to said output unit as said first sampling signal.

3. A timing generating apparatus as claimed in claim 1, further comprising a first variable delay circuit for delaying said sampling clock by a desired time interval,
   wherein said first sampling unit samples said first basic waveform based on said sampling clock delayed by said first variable delay circuit.

4. A timing generating apparatus as claimed in claim 1, further comprising a first variable delay circuit for delaying said first sampling signal outputted by said first sampling unit by a desired time interval,
   wherein a first selecting unit selects said first sampling signal outputted by either said first basic waveform or said first variable delay circuit.

5. A timing generating apparatus as claimed in claim 1, wherein said first sampling unit holds a value of said first basic waveform at a leading edge of said sampling clock for a predetermined time interval, and outputs said value of said first basic waveform held as a value of said first sampling signal.

6. A timing generating apparatus as claimed in claim 5, wherein said first sampling unit is a D flip-flop whose input terminal receives said first basic waveform, whose clock terminal receives said sampling clock, and whose output terminal supplies an output thereof to a reset terminal of said D flip-flop.

7. A timing generating apparatus as claimed in claim 3, wherein said first variable delay circuit delays said sampling clock by a time interval which is larger than jitter of said first basic waveform.

8. A timing generating apparatus as claimed in claim 1, further comprising a period generating unit for generating a PLL input signal whose frequency is an integer multiple of said basic frequency or a reciprocal of an integer multiple thereof,
   wherein said PLL comprises a frequency synthesizer for generating said sampling clock whose jitter is smaller than that of said PLL input signal and whose period is substantially the same as said PLL input signal based on said PLL input signal.

9. A timing generating apparatus as claimed in claim 8, wherein said period generating unit generates said PLL input signal by receiving a reference clock, modulating a phase of said reference clock with a predetermined gradation number and taking a desired pulse of said reference clock modulated, and
   said frequency synthesizer comprises:
   an oscillator for generating an oscillating signal of a desired frequency;
   a first frequency divider for dividing a frequency of said PLL input signal into a same frequency division number as said gradation number;
   a second frequency divider for dividing a frequency of said oscillating signal into a frequency division number which is an integer multiple of said gradation number; and
   a phase comparator for controlling a period of said oscillating signal generated by said oscillator based on a phase difference between said PLL input signal whose frequency is divided by said first frequency divider and said oscillating signal whose frequency is divided by said second frequency divider.

10. A timing generating apparatus as claimed in claim 9, wherein said first waveform generating unit receives said reference clock and generates said first basic waveform based on said reference clock.

11. A timing generating apparatus as claimed in claim 1, further comprising:

a second waveform generating unit for generating a second basic waveform whose value changes only at change timing of said basic frequency and which has a predetermined phase difference from said first basic waveform; and a second sampling unit for outputting a second sampling signal which results from sampling said second basic waveform with said sampling clock delayed by said predetermined phase difference, wherein said output unit outputs said timing signal based on said first and second sampling signals.

12. A timing generating apparatus as claimed in claim 11, wherein said output unit comprises a latch unit for generating said timing signal by holding H logic in response to an edge of said first sampling signal, whereas holding L logic in response to an edge of said second sampling signal.

13. A timing generating apparatus as claimed in claim 11, further comprising:

a third waveform generating unit for generating a third basic waveform whose value changes only at change timing of said basic frequency and whose phase is later than said first basic waveform; and a fourth waveform generating unit for generating a fourth basic waveform whose value changes only at change timing of said basic frequency and whose phase is later than said second basic waveform, wherein said first sampling unit generates said first sampling signal by sampling a signal interleaved with said first and third basic waveforms based on said sampling clock, and said second sampling unit generates said second sampling signal by sampling a signal interleaved with said second and fourth basic waveforms based on said sampling clock.

14. A test apparatus for testing an electronic device, comprising:

a pattern generating unit for generating a test signal to test said electronic device;

a timing generating apparatus for generating a timing signal which changes at desired timing;

a waveform adjusting unit for adjusting said test signal and supplying said test signal adjusted to said electronic device based on said timing signal; and a judging unit for judging quality of said electronic device based on an output signal outputted by said electronic device based on said test signal, wherein said timing generating apparatus comprises:

a first waveform generating unit for generating a first basic waveform whose value changes only at change timing of a basic frequency;

a PLL for generating a sampling clock whose frequency is an integer multiple of said basic frequency and whose phase is more stable than said first basic waveform based on a PLL input signal whose frequency is an integer multiple of said basic frequency or a reciprocal of an integer multiple thereof;

a first sampling unit for outputting a first sample signal which results from sampling said first basic waveform with said sampling clock; and an output unit outputs said timing signal based on said sampling signal.

* * * * *